United States Patent
Gao

(10) Patent No.: US 11,839,064 B2
(45) Date of Patent: Dec. 5, 2023

(54) RACK LIQUID DISTRIBUTION SYSTEM WITH REDUNDANT DESIGN

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

(*) Notice: Subject to any disclaimer, the term of this patent is extended or adjusted under 35 U.S.C. 154(b) by 285 days.

(21) Appl. No.: 17/233,726

(22) Filed: Apr. 19, 2021

(65) Prior Publication Data
US 2022/0338388 A1    Oct. 20, 2022

(51) Int. Cl.
| G06F 1/16 | (2006.01) |
| H05K 5/00 | (2006.01) |
| H05K 7/00 | (2006.01) |
| H05K 7/20 | (2006.01) |

(52) U.S. Cl.
CPC ..... *H05K 7/20836* (2013.01); *H05K 7/20763* (2013.01)

(58) Field of Classification Search
CPC .............. H05K 7/20836; H05K 7/20763
See application file for complete search history.

(56) References Cited

U.S. PATENT DOCUMENTS

| 4,180,988 A * | 1/1980 | Forte ................. F25B 13/00 62/474 |
| 10,201,116 B1 * | 2/2019 | Ross ............... H05K 7/20836 |
| 10,225,958 B1 * | 3/2019 | Gao ................ H05K 7/20781 |
| 11,683,913 B2 * | 6/2023 | Zhang ............. H05K 7/20772 361/679.53 |
| 2010/0290190 A1 * | 11/2010 | Chester ............... B65B 63/08 174/547 |
| 2014/0124167 A1 * | 5/2014 | Campbell .......... H05K 7/20809 165/96 |
| 2022/0240421 A1 * | 7/2022 | Zhang ............. H05K 7/20772 |

* cited by examiner

*Primary Examiner* — Anthony M Haughton
(74) *Attorney, Agent, or Firm* — WOMBLE BOND DICKINSON (US) LLP

(57) ABSTRACT

Embodiments are disclosed of a rack cooling apparatus, more specially, a rack fluid control and management unit with a first pair of fluid lines including a first supply line and a first return line and a second pair of fluid lines including a second supply line and a second return line. The first supply line and the first return line are adapted to be coupled to a first rack manifold and the second supply line and the second return line are adapted to be coupled to a second rack manifold in the same rack as the first rack manifold. First and second bi-directional fluid lines fluidly couple the first supply line to the second supply line.

20 Claims, 7 Drawing Sheets

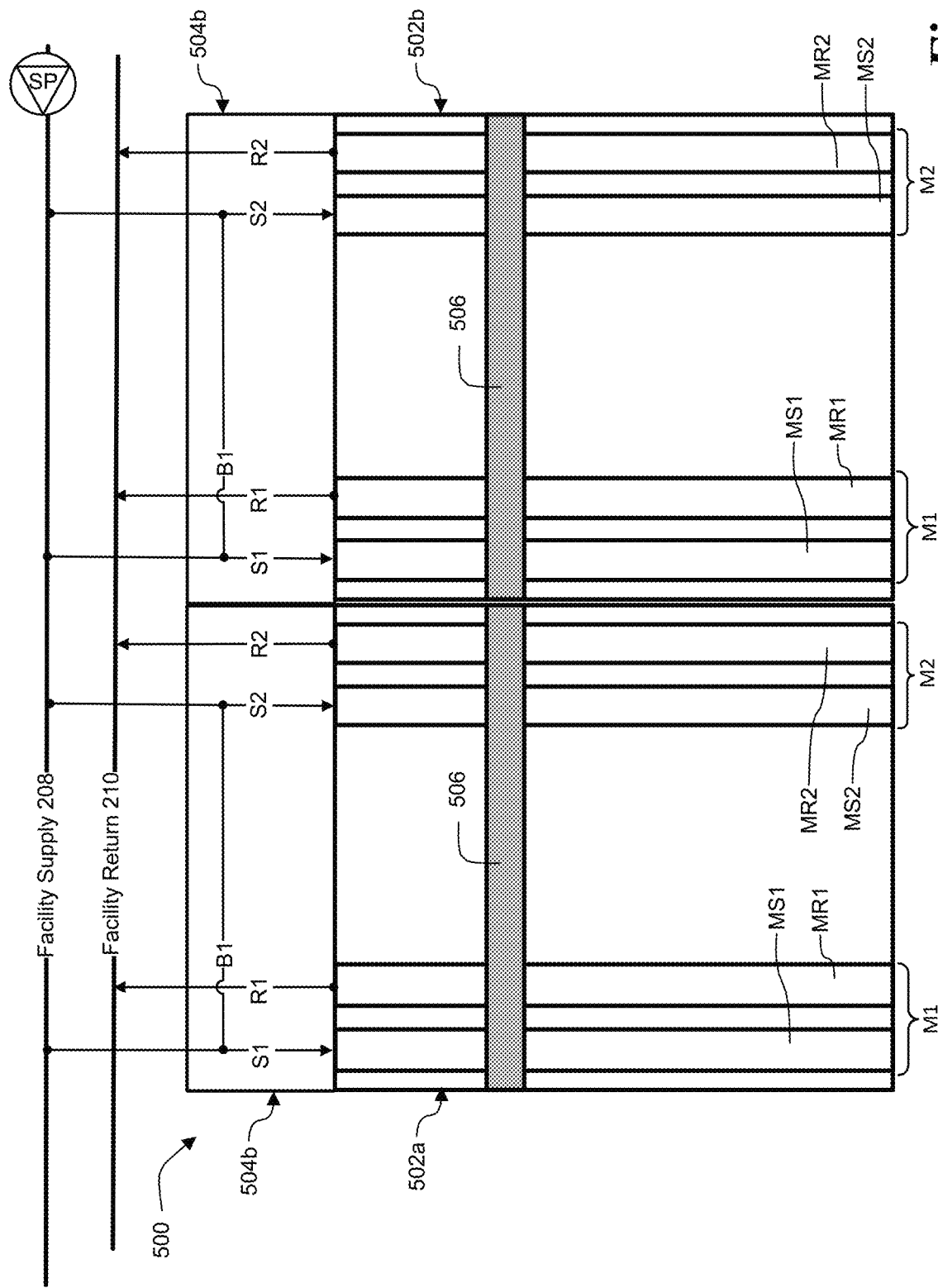

RACK LIQUID DISTRIBUTION SYSTEM WITH REDUNDANT DESIGN

TECHNICAL FIELD

The disclosed embodiments relate generally to servers and in particular, but not exclusively, to a liquid distribution system used with an information technology (IT) rack of the kind found in data centers.

BACKGROUND

Modern data centers, such as cloud computing centers, house enormous amounts of information technology (IT) equipment such as servers, blade servers, routers, edge servers, power supply units (PSUs), battery backup units (BBUs), etc. These individual pieces of IT equipment are typically housed in racks within the computing center, with multiple pieces of IT equipment in each rack. The racks are typically grouped into clusters within the data center.

As IT equipment has become more computationally powerful it also consumes more electricity and, as a result, generates more heat. This heat must be removed from the IT equipment to keep it operating properly. To keep up with this increasing need for heat removal, IT equipment has incorporated internal liquid cooling systems and, at the same time, the IT racks in which IT equipment is housed have incorporated rack-level liquid cooling systems that interface with the internal liquid cooling systems of the IT equipment.

One problem with current rack-level cooling systems is that they create a single failure point in the entire liquid cooling system: a single failure anywhere in the rack-level liquid cooling system causes all the IT equipment in the rack to shut down. Designing a rack-level liquid cooling system that eliminates the single failure point is challenging; simple changes, such as adding fluid distribution components to the rack, might not function properly because such rack-level changes often require corresponding changes in the IT equipment—changes that can only be made effectively by designing the rack and IT equipment together.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 5A is a rear view of a cluster of IT racks, each rack including an embodiment of a liquid distribution system with a redundant design.

DETAILED DESCRIPTION

Figure 1:
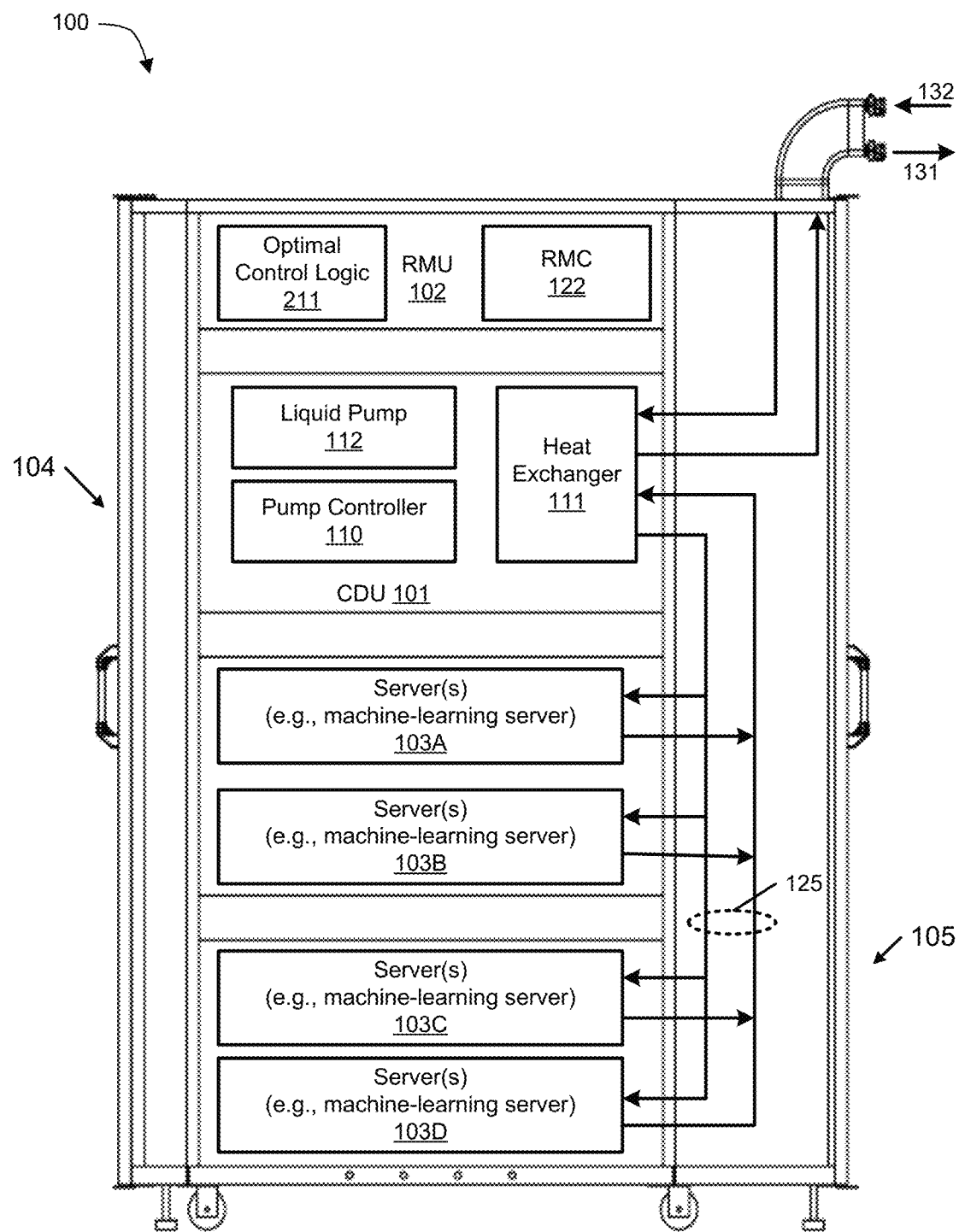
FIG. 1 is a side view of an embodiment of a liquid-cooled information technology (IT) rack populated with various pieces of IT equipment.

Embodiments are described of a liquid distribution system for use with an information technology (IT) rack. Specific details are described to provide an understanding of the embodiments, but one skilled in the relevant art will recognize that the invention can be practiced without one or more of the described details or with other methods, components, materials, etc. In some instances, well-known structures, materials, or operations are not shown or described in detail but are nonetheless encompassed within the scope of the invention.

Reference throughout this specification to "one embodiment" or "an embodiment" means that a described feature, structure, or characteristic can be included in at least one described embodiment, so that appearances of "in one embodiment" or "in an embodiment" do not necessarily all refer to the same embodiment. Furthermore, the particular features, structures, or characteristics may be combined in any suitable manner in one or more embodiments. As used in this application, directional terms such as "front," "rear," "top," "bottom," "side," "lateral," "longitudinal," etc., refer to the orientations of embodiments as they are presented in the drawings, but any directional term should not be interpreted to imply or require a particular orientation of the described embodiments when in actual use.

Embodiments are described below of a liquid distribution system for use with an information technology (IT) racks. The described redundant rack-level coolant distribution system eliminates single-failure-point risk in the system. The described embodiments equip an IT rack with redundant cooling, but without increasing the cost dramatically. Some embodiments can include advanced features for operating the distribution system during the failure scenarios using a secondary self-activated direct-connection loop. In an embodiment, the redundant solution is packaged in a unit called a redundant coolant control unit (RCCU) which can be coupled to a rack without requiring any modification of the facility system. And within the proposed distribution system, an embodiment of a flowrate-based control can be used to operate and regulate the system.

FIG. 1 is a block diagram illustrating a side view of an embodiment of an information technology (IT) rack, which is a type of IT container commonly used in data centers. In one embodiment, electronic rack 100 includes CDU 101, rack management unit (RMU) 102, and one or more server blades 103A-103D, collectively referred to as server blades 103. Server blades 103 can be inserted into an array of server slots respectively from front end 104 of electronic rack 100. Note that although only four server blades 103A-103D are shown, more or fewer server blades can be maintained within electronic rack 100. Also note that the particular positions of CDU 101, CMU 102, and server blades 103 are shown for the purpose of illustration only; other arrangements or configurations of CDU 101, CMU 102, and server blades 103 can also be implemented. Further, the front door disposed on front end 104 and the back door disposed on back end 105 are optional. In some embodiments, there can no door on front end 104 and/or back end 105.

In one embodiment, CDU 101 includes heat exchanger 111, liquid pump 112, and pump controller 110. Heat exchanger 111 can be a liquid-to-liquid heat exchanger. Heat exchanger 111 includes a first tube having a first pair of liquid connectors coupled to external liquid supply/return lines 131-132 to form a primary loop, where the connectors coupled to the external liquid supply/return lines 131-132 can be disposed or mounted on back end 105 of electronic rack 100. In addition, heat exchanger 111 further includes a second tube having a second pair of liquid connectors coupled to liquid manifold 125, which can include a supply manifold to supply cooling liquid to server blades 103 and a return manifold to return warmer liquid back to CDU 101. The processors can be mounted on the cold plates, where the cold plates include a liquid distribution channel embedded therein to receive the cooling liquid from the liquid manifold 125 and to return the cooling liquid carrying the heat exchanged from the processors back to the liquid manifold 125. Rack 100 is an example of an IT rack in which embodiments of a liquid distribution system, such as the ones shown in FIG. 2 et seq., can be used.

Each server blade 103 can include one or more IT components (e.g., CPUs, GPUs, memory, and/or storage devices). Each IT component can perform data processing tasks, where the IT component can include software installed in a storage device, loaded into the memory, and executed by one or more processors to perform the data processing tasks. Server blades 103 can include a host server (referred to as a host node) coupled to one or more compute servers (also referred to as compute nodes). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the compute servers (having one or more GPUs) managed by the host server. The compute servers perform the actual tasks, which can generate heat during the operations.

Electronic rack 100 further includes RMU 102 configured to provide and manage power supplied to server blades 103 and CDU 101. RMU 102 can be coupled to a power supply unit (not shown) to manage the power consumption of the power supply unit, as well as other thermal management of the power supply unit (e.g., cooling fans). The power supply unit can include the necessary circuitry (e.g., an alternating current (AC) to direct current (DC) or DC to DC power converter, battery, transformer, or regulator, etc.) to provide power to the rest of the components of electronic rack 100.

In one embodiment, RMU 102 includes optimal control logic 111 and rack management controller (RMC) 122. The optimal control logic 111 is coupled to at least some of server blades 103 to receive operating status of each of the server blades 103, such as processor temperatures of the processors, the current pump speed of the liquid pump 112, and liquid temperature of the cooling liquid, etc. Based on this information, optimal control logic 111 determines an optimal pump speed of the liquid pump 112 by optimizing a predetermined objective function, such that the output of the objective function reaches the maximum while a set of predetermined constraints is satisfied. Based on the optimal pump speed, RMC 122 is configured to send a signal to pump controller 110 to control the pump speed of liquid pump 112 based on the optimal pump speed.

Figure 2:
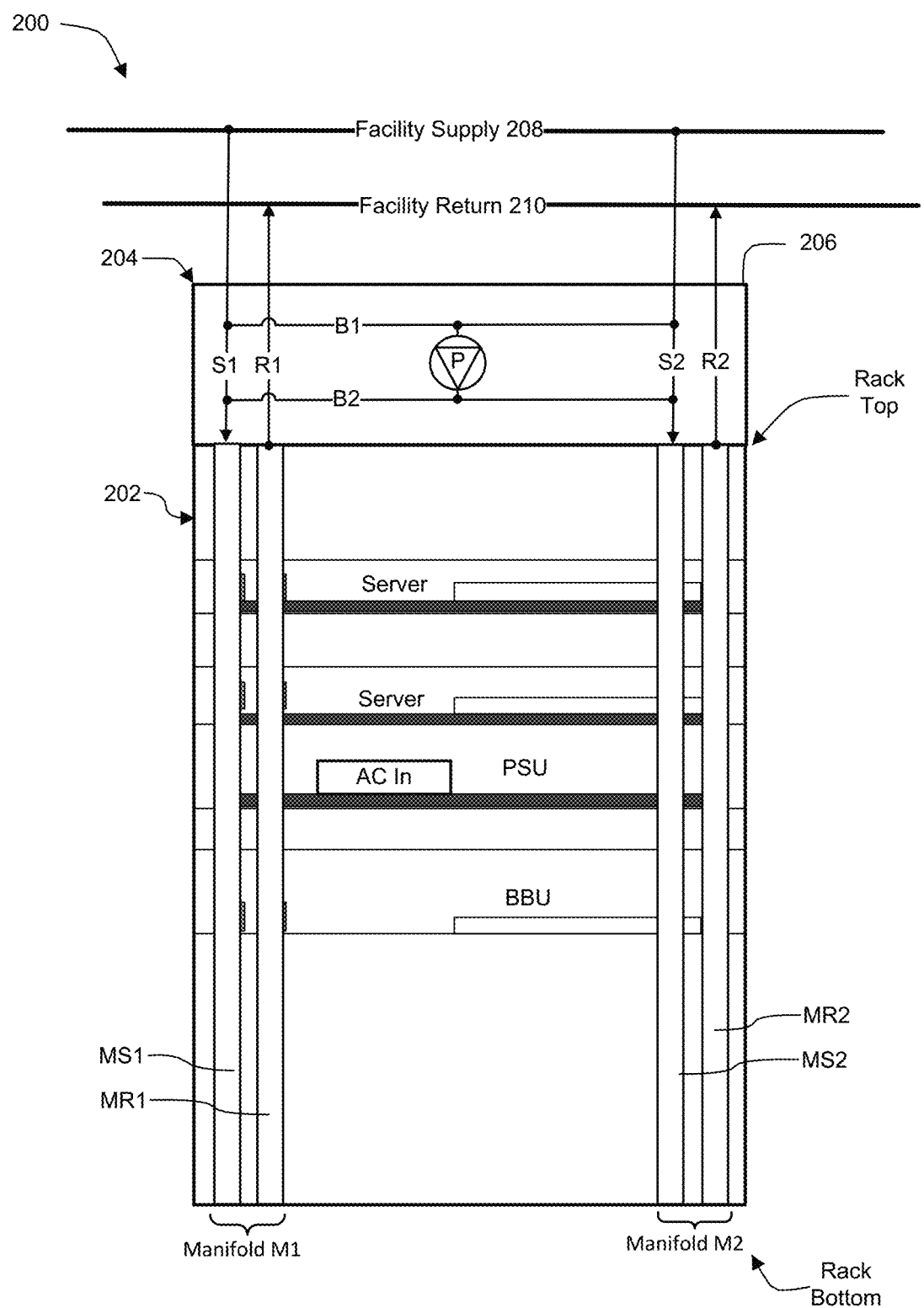
FIG. 2 is a rear view of an information technology (IT) rack including an embodiment of a liquid distribution system with a redundant design.

FIG. 2 illustrates a cooling system 200 with an embodiment of an information technology (IT) rack having redundant fluid distribution capability. System 200 includes a rack 202, on top of which is positioned a cooling unit 204. Rack 202 includes a pair of cooling manifolds, including a first manifold M1 and a second manifold M2. In the illustrated embodiment manifolds M1 and M2 are both two-chamber manifolds with a supply chamber and a separate return chamber. Thus, manifold M1 has a supply chamber MS1 and a return chamber MR1 and manifold M2 has a supply chamber MS2 and a return chamber MR2. The separate supply and return chambers allow the supply and return in each set of manifolds to be replaced or serviced independently. In the illustrated embodiment, manifolds M1 and M2 extend the full height of rack 202, from the rack bottom to the rack top, so that both manifolds can be used to provide cooling to all IT equipment positioned in the rack. Rack 202 can be populated with various types of IT equipment, such as servers, battery backup units, power supply units, etc., and need not be uniformly populated with the same type of IT equipment—for instance, rack 202 can be, but need not be, populated entirely with servers. In the illustrated embodiment manifolds M1 and M2 are positioned at or near the sides of rack 202, but in other embodiments the manifolds can be positioned differently than shown (see, e.g., FIG. 6).

Cooling unit 204, which can be referred to as a Redundant Coolant Control Unit (RCCU), sits on top of rack 202 and is used to control the supply and return of cooling liquid to and from manifolds M1 and M2, especially in cases where one of the manifolds becomes impaired and starts operating at reduced capacity, for instance due to maintenance, or fails completely. The RCCU is mounted on the rack and is used for regulating the fluid flow to the rack in both normal and redundant modes. The basic function is that when one of the fluid manifold supply is not used in normal mode (e.g., during manifold service, maintenance, or failure), the other set of supply lines is used as the cooling delivery loop. In the illustrated embodiment cooling unit 204 is located on top of the rack, but in other embodiments the cooling unit can be also be located elsewhere within the rack, which can require some changes on both the facility side and the rack manifold side.

Cooling unit 204 includes two pairs of fluid lines: a first pair that includes supply line S1 and return line R1, and a second pair that includes supply line S2 and return line R2. When the cooling unit is in use, supply lines S1 and S2 fluidly couple manifold supply chambers MS1 and MS2 to a facility supply line 208, while return lines R1 and R2 fluidly couple manifold return chambers MR1 and MR2 to a facility return line 210. Facility supply line 208 and facility return line 210 are lines that are part of a central fluid distribution system in the data center or other facility in which system 200 is located. The facility supply line supplies cooling fluid to racks or clusters of racks within the facility, while the facility return line removes hot cooling fluid from clusters of racks.

A pair of bi-directional bypass lines B1 and B2 are located within unit 204. Both bypass lines B1 and B2 are fluidly coupled between the two supply lines: bypass line B1 is fluidly coupled between supply lines S1 and S2, and so is bypass line B2. Both bypass lines B1 and B2 are bi-directional, meaning that fluid can flow through them in either direction—from supply line S1 toward supply line S2, or from supply line S2 toward supply line S1—through all or part of each bypass line. Bypass lines B1 and B2 can also be referred to as redundancy lines because they can provide fluid supply redundancy in case one of the manifolds fails (see, e.g., FIGS. 3A-3B).

In the illustrated embodiment a pump P can be coupled between bypass lines B1 and B2 to help regulate the flow of fluid in the cooling unit, but in other embodiments pump P can be omitted. Pump P can be used in different modes to regulate the flow of fluid from the central distribution system into the rack. Since the facility supply and return are controlled by a central delivery unit and the corresponding control, it is important to have a local regulation design for the redundant systems, since the facility fluid may not be sufficient even with single active manifold. This ensures proper function and high efficiency of the distributed redundant design. As described below, pump P can work in different modes. In a normal mode it can operate as local cooling enhancement device and fluid regulating unit, but in a failure mode it provides redundancy. Pump P can be controlled based on actual flow rate: it can be kept idle, no change, decrease, or increase.

In cooling system 200, cooling unit 204 can be used in different modes. A normal mode of operation is one in which both manifolds function. There are two normal modes: passive and active. In a normal passive mode, pump P can be switched off, allowing a passive exchange of cooling fluid between supply lines S1 and S2 through bypass lines B1 and B2. In a normal active mode were both manifolds M1 and M2 are operating properly, pump P can be used to control and/or boost flow from the facility supply 208 into both manifolds. Normal active mode can be especially useful for regulating fluid flow when different racks in a cluster are nonhomogeneous in terms of the server and heat density. This significantly simplifies the central distribution system. In addition to the two normal modes, cooling unit 204 can operate in a redundant mode, as described below in FIGS. 3A-3B, in which the cooling unit can compensate for loss of flow through one manifold by directing additional flow into the other manifold. In the redundant mode, pump P is used to regulate the fluid flow to ensure sufficient fluid goes to the rack. In one scenario, is a fluid return line is deactivated but both supply lines works, pump P can still function since the return line is decreased which may cause system pressure increase.

Figure 3A:
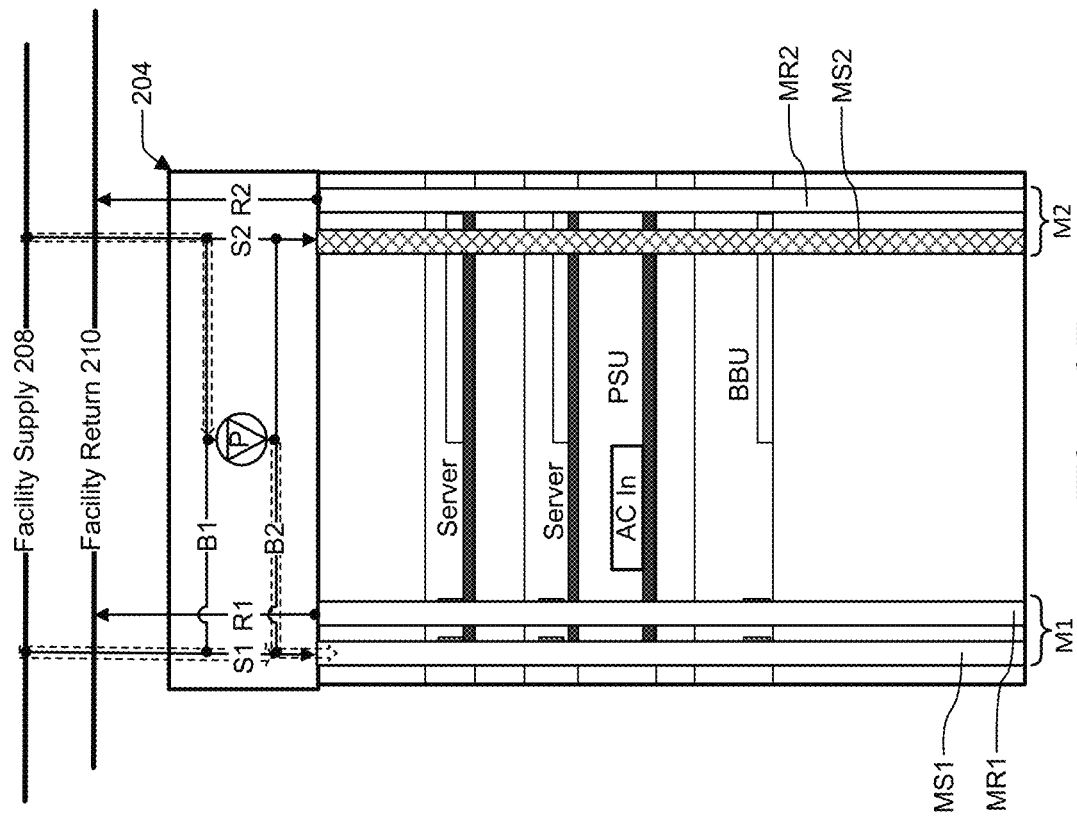
FIGS. 3A-3B are rear views of the IT rack of FIG. 2 illustrating embodiments of the operation of the liquid distribution system.
Figure 3B:
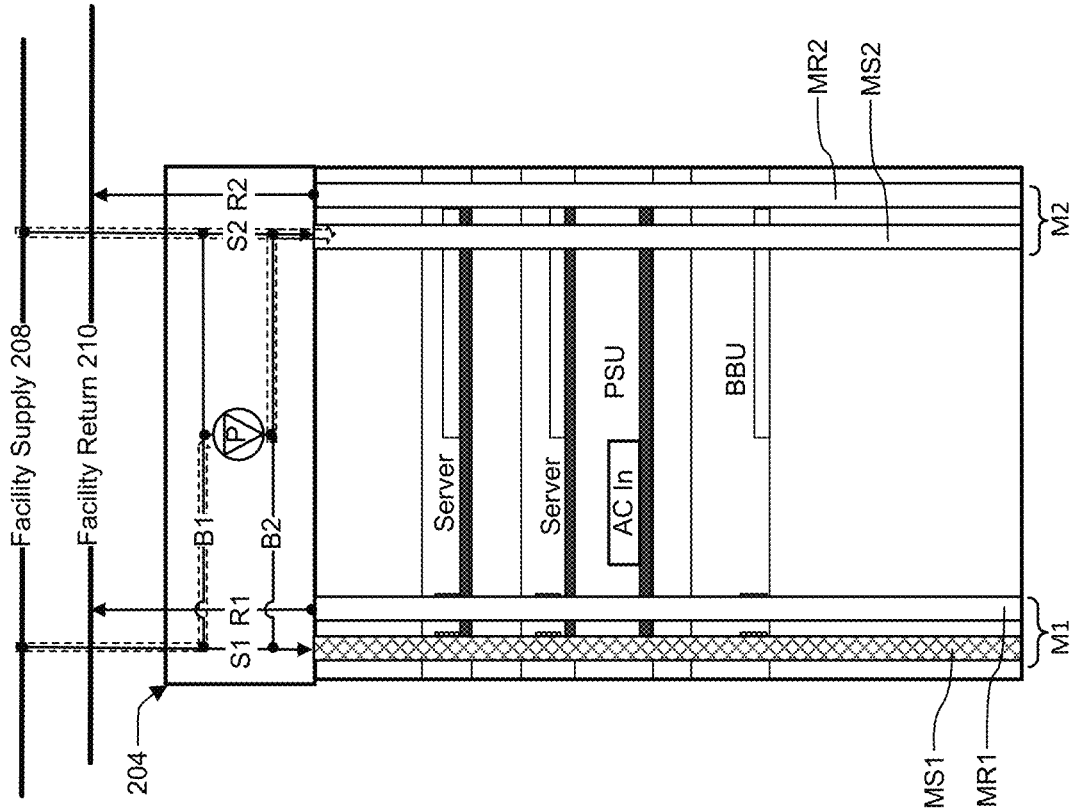

FIGS. 3A-3B illustrate embodiments of the operation of cooling system 200 in a redundancy mode. During operation of cooling system 204, a chamber in manifolds M1 or M2 might become impaired (e.g., flow rate might decrease) or might stop working altogether, for instance if one of the chambers in the manifold becomes blocked or is removed from rack 204 for maintenance or service. In such cases, cooling system 204 can make up for the loss of the non-working manifold chamber by directing additional cooling fluid to the other manifold. As described below, the pair of bidirectional line B1-B2 can be considered to have two sections: a first section including the left branch of B1 with the right branch of B2, and a second section including the right branch of B1 with the left branch of B2. The two sections functions differently, in the opposite direction in terms of the fluid flowing directions.

FIG. 3A illustrates an embodiment of operation of the system in which MS1, the supply chamber of manifold M1, shown cross-hatched, becomes impaired or stops working. If this happens, the fluid from facility supply 208 that previously flowed through supply line S1 directly into manifold supply chamber MS1 now stops flowing into chamber MS1 and instead flows to pump P through the branch of bypass line B1 that fluidly couples supply line S1 to the pump (i.e., the left branch of B1). Pump P then directs the flow it receives from bypass line B1 into the branch of bypass line B2 that fluidly couples the pump to supply line S2 (i.e., the right branch of B2). This flow path is illustrated in the figure by dashed arrows. In this configuration, then, when manifold M1 is impaired supply line S2 receives cooling fluid from two sources: facility supply 208 and bypass line B2. The combined cooling fluid from these sources increases the flow of cooling fluid through chambers MS2 and MR2 of manifold M2, thus compensating for the loss of manifold M1 and allowing the IT equipment in rack 204 to be kept cool—within acceptable temperature limits, for instance—using only manifold M2.

FIG. 3B illustrates an embodiment of operation of the system in which MS2, the supply chamber of manifold M2, shown cross-hatched, becomes impaired or stops working. If this happens, the fluid from facility supply 208 that previously flowed through supply line S2 directly into manifold chamber MS2 now stops flowing into chamber MS2 and instead flows to pump P through the branch of bypass line B1 that fluidly couples supply line S2 to the pump (i.e., the right branch of B1). Pump P then directs the flow it receives from bypass line B1 into the branch of bypass line B2 that fluidly couples the pump to supply line S1 (i.e., the left branch of S2). This flow path is illustrated in the figure by dashed arrows. In this configuration, then, when manifold M2 is impaired supply line S1 receives cooling fluid from two sources: facility supply 208 and bypass line B2. The combined cooling fluid from these sources increases the flow of cooling fluid through chambers MS1 and MR1 of manifold M1, thus compensating for the loss of manifold M2 and allowing the proper amount of fluid running through the rack and IT equipment in rack 204 to be kept cool—within acceptable temperature limits, for instance—using only manifold M1.

Figure 4:
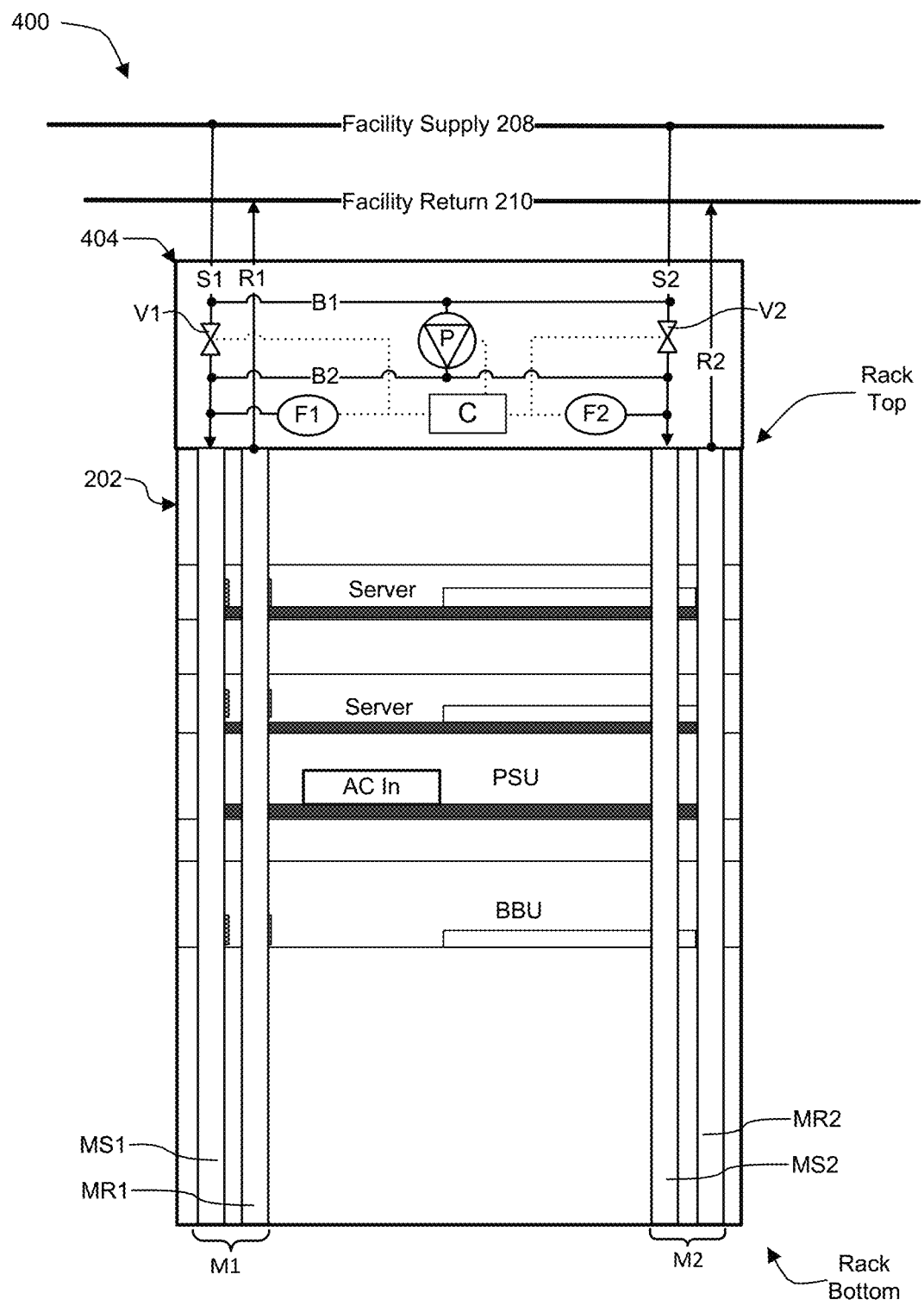
FIG. 4 is a rear view of an IT rack including another embodiment of a liquid distribution system with a redundant design.

FIG. 4 illustrates an embodiment of a cooling system 400 with a redundant design for use with information technology (IT) racks. As in system 200, system 400 includes a rack 202 on top of which is positioned a cooling unit 404. Cooling unit 404 is in most respects similar to cooling unit 204. The primary difference between cooling units 204 and 404 is that cooling unit 404 includes additional components to help regulate the function of the cooling unit.

The fluid connections within cooling unit 404 are similar to the fluid connections in cooling unit 204. There are two pairs of fluid lines: a first pair including supply line S1 and return line R1, and a second pair including supply line S2 and return line R2. Supply lines S1 and S2 fluidly couple manifold supply chambers MS1 and MS2 to a facility supply line 208, and return lines R1 and R2 fluidly couple manifold return chambers MR1 and MR2 to a facility return line 210. A pair of bi-directional bypass lines B1 and B2 are fluidly coupled between the two supply lines: bypass line B1 is fluidly coupled between supply lines S1 and S2, and so is bypass line B2. In the illustrated embodiment a pump P can be coupled between bypass lines B1 and B2 to help regulate the flow of fluid in the cooling unit, but in some embodiments pump P can be omitted.

Cooling unit 404 includes additional components to help control and regulate the flow through the cooling unit. A first control valve V1 is fluidly coupled in supply line S1 and a second control valve V2 is fluidly coupled in supply line S2. In the illustrated embodiment both control valves V1 and V2 are coupled in their respective supply lines between where bypass lines B1 and B2 are coupled to each supply line, but in other embodiments valves V1 and V2 can be positioned in their supply lines differently than shown. A first flow meter F1 is fluidly coupled to supply line S1 and a second flow meter F2 is fluidly coupled to supply line S2. Both flow meters F1 and F2 measure the flow rate of cooling fluid through their respective supply lines. Both control valves V1 and V2, as well as both flow meters F1 and F2, are communicatively coupled to a controller C, as indicated by the dotted line in the figure. Controller C is further communicatively coupled to pump P, as indicated by the dotted line in the figure. Note that not all embodiments need have all these components. Other embodiments, for instance, can include flow meters F1 and F2 but not valves V1 or V2, and still other embodiment can include valves V1 and V2 but not flow meters F1 or F2. In embodiments that include one or both of control valves the one in the two, the valves need not be actuated by a controller such as controller C, but can instead be manually actuated.

In the illustrated embodiment, communicative coupling of controller C to valves V1 and V2, flow meters F1 and F2, and pump P allows the controller to direct operation of the cooling unit. In the redundant mode of operation shown in FIG. 3A, for instance, where manifold M1 fails, controller C can attempt to maintain the sum of flow rates constant (i.e., F1+F2=constant), or as close to constant as possible, by closing valve V1 and increasing the speed of pump P to direct more flow into supply line S2. Thus, if flow rate F1 drops to zero, flow rate F2 is doubled to make up for the loss of flow rate F1. In an embodiment of cooling unit 404 without valve V1, controller C could simply increase the speed of pump P. Pump P thus ensures that the total flow rate follows the rack's requirement. In the redundant mode of operation of FIG. 3B, controller C can function similarly—maintaining F1+F2 constant, or as close to constant as possible, by closing valve V2 and increasing the speed of pump P to direct more flow into supply line S1. Other embodiments of controller C need not use keeping the sum of flow rates constant as the goal. For instance, in other embodiments if F1 drops to zero the controller can simply command pump P to increase speed by a certain amount, or can command the pump to increase F2 by a specified percentage between 0% and 100%.

Control valves V1 and V2 can also be used in one of the normal modes of operation, for instance in the normal active mode. By opening valves V1 and V2 and idling the pump, the system is operated in normal passive mode; by closing valves V1 and V2 and operating the pump, the system is operated in normal active mode.

Figure 5B:
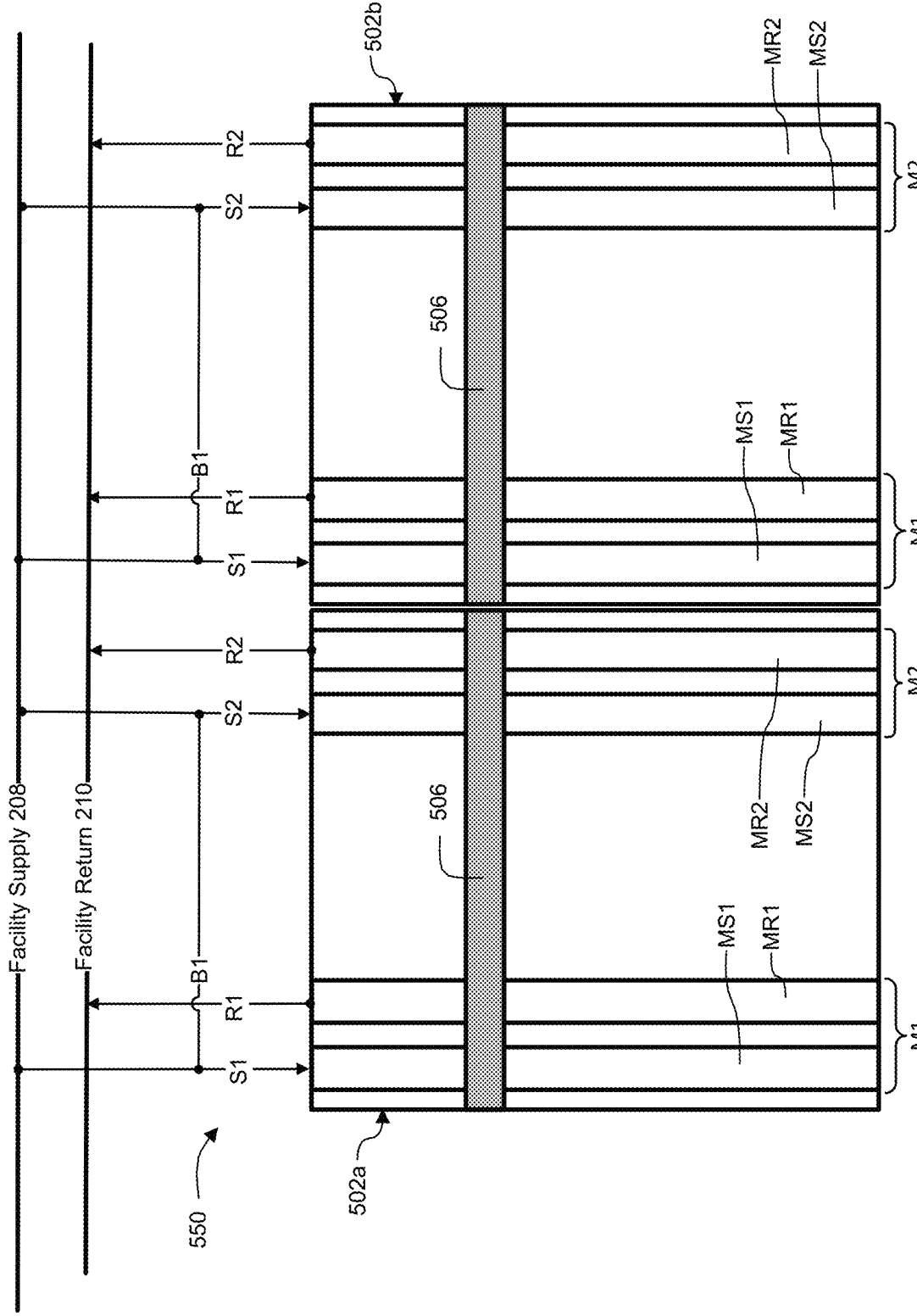
FIG. 5B is a rear view of a cluster of IT racks, each rack including another embodiment of a liquid distribution system with a redundant design.

FIGS. 5A-5B illustrate embodiments of a fluid distribution system applied to a cluster of IT racks. In most data centers, individual IT racks are grouped into clusters for cooling purposes. The illustrated embodiments show a cluster with two racks 502a and 502b, but other cluster embodiments can include more or less racks than shown.

FIG. 5A illustrates a fluid distribution system 500. In system 500, each rack 502 is configured substantially as described above for rack 202. Thus, racks 502a and 502b each include a pair of cooling manifolds, including a first manifold M1 and a second manifold M2. In the illustrated embodiment manifolds M1 and M2 are both two-chamber manifolds. Thus, manifold M1 has a supply chamber MS1 and a return chamber MR1, while manifold M2 has a supply chamber MS2 and a return chamber MR2. In the illustrated embodiment, manifolds M1 and M2 extend the full height of rack 502, from the rack bottom to the rack top, so that both manifolds can be used to provide cooling to all IT equipment positioned in the rack. Each rack 502 can be populated with various types of IT equipment 502, such as servers, battery backup units, power supply units, etc., and in various embodiments need not be uniformly populated with the same type of IT equipment—for instance, racks 502 can be, but need not be, populated entirely with servers. In the illustrated embodiment manifolds M1 and M2 are positioned at or near the sides of rack 502, but in other embodiments the manifolds can be positioned differently than shown.

Each rack 502 is coupled with a corresponding cooling unit 504—rack 502a with cooling unit 504a, rack 502b with cooling unit 504b, and so on. Cooling units 504 sit on top of racks 502 and are used in each rack to control the supply and return of cooling liquid to and from manifolds M1 and M2, especially in cases where one of the manifolds starts operating at reduced capacity, for instance due to maintenance, or fails completely.

Each cooling unit 504 includes two pairs of fluid lines: a first pair including supply line S1 and return line R1, and a second pair including supply line S2 and return line R2. When each cooling unit is in use, supply lines S1 and S2 fluidly couple manifold supply chambers MS1 and MS2 to a facility supply line 208, while return lines R1 and R2 fluidly couple manifold return chambers MR1 and MR2 to a facility return line 210. Facility supply line 208 and facility return line 210 are lines that are part of a central fluid distribution system in the data center, or other facility in which system 500 is located, that provides cooling fluid to racks or clusters of racks within the facility.

Also in each cooling unit 504 is a bi-directional bypass line B1 that is fluidly coupled between supply lines S1 and S2. Each bypass line B1 is bi-directional, meaning that fluid can flow in either direction—from supply line S1 toward supply line S2, or from supply line S2 toward supply line S1—through all or part of the bypass line. Bypass line B1 can also be referred to as a redundancy line because it provides fluid supply redundancy in case one of the manifolds fails (see FIGS. 3A-3B). In the illustrated embodiment a pump SP is coupled in facility supply line 208 to help control the flow of fluid in the cooling unit if a manifold becomes impaired in any of the racks, so that pump SP functions as a centralized pump for the entire system.

FIG. 5B illustrates another embodiment of a fluid distribution system 550. Fluid distribution system 550 is in most respects similar to fluid distribution system 500. The primary is that in fluid distribution system 550, for each rack 502, the supply lines S1 and S2, return lines R1 and R2, and bypass lines B1 are part of the facility (e.g., the data center) rather than part of a cooling unit that is positioned on top of each rack. In this embodiment, then, the supply lines, return lines, and bypass lines become the responsibility of the facility rather than the responsibility of whoever provides and populates the individual racks. In addition, fluid distribution system 550 has no additional pump SP in the facility supply line 208. Fluid distribution system 550 can be useful in applications where fluid flow between and among racks in a cluster are very uniform and all the racks are arranged homogeneously within each cluster. In the embodiment of FIG. 5A, cooling units 504 can be understood as an extension of the rack, while the embodiment of FIG. 5B can be understood as a feature developed or added on the facility side.

Figure 6:
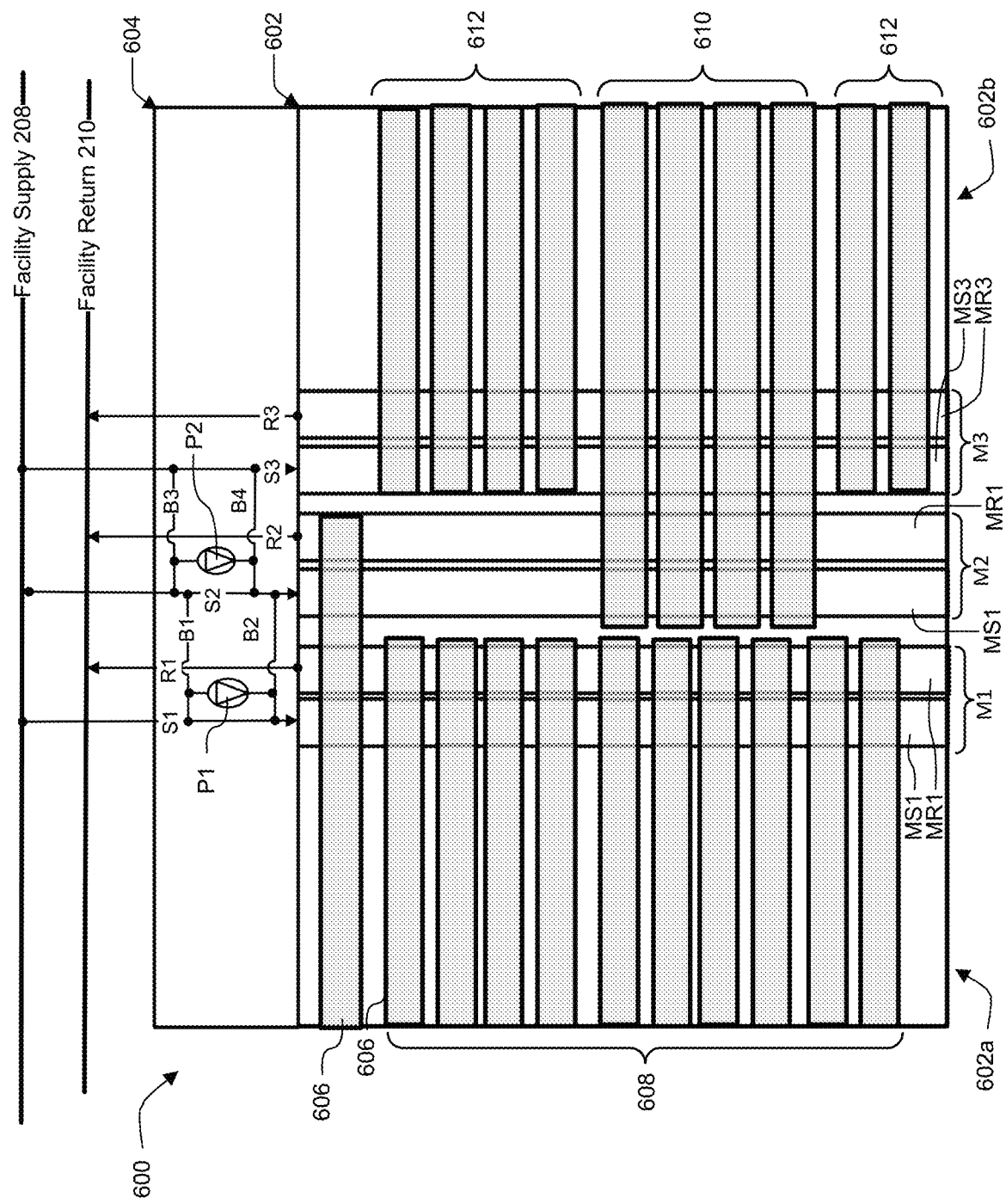
FIG. 6 is a rear view of an embodiment of an IT rack including a liquid distribution system with a redundant design.

FIG. 6 illustrates an embodiment of a rack cooling system 600. In some instances, a rack might need to house both IT equipment that is adapted to be fluidly coupled to multiple cooling manifolds and IT equipment that is not adapted to be fluidly coupled to multiple manifolds. Cooling system 600 provides this capability.

Cooling system 600 includes a rack 602 with two halves or columns 602a and 602b. Each half or column is the width of a traditional single-column rack and can accommodate various pieces of IT equipment the same way a single-column rack does. Rack 602 can be populated with various types of IT equipment, such as servers, battery backup units, power supply units, etc., and in various embodiments columns 602a and 602b need not be uniformly populated with the same type of IT equipment—for instance, column 602a can be, but need not be, populated entirely with servers.

Rack 602 includes three cooling manifolds: a first manifold M1, a second manifold M2, and a third manifold M3. In the illustrated embodiment, each of manifolds M1-M3 is a two-chamber manifold with a supply chamber and a separate return chamber. Thus, manifold M1 has a supply chamber MS1 and a return chamber MR1, manifold M2 has a supply chamber MS2 and a return chamber MR2, and manifold M3 has a supply chamber MS3 and a return chamber MR3. With this design, each manifold is separate and the supply and return in each manifold can be replaced or serviced independently. In the illustrated embodiment, manifolds M1-M3 extend the full height of rack 602, from the rack bottom to the rack top, so that all three manifolds can be used to provide cooling to all IT equipment positioned in the rack. In the illustrated embodiment manifold M1 is positioned at or near a side of column 602a, manifold M3 is positioned at or near a side of column 602b, and manifold M2 is positioned between manifolds M1 and M3. In other embodiments manifolds M1-M3 can be positioned differently than shown.

Cooling unit 604, which can be referred to as a Redundant Coolant Control Unit (RCCU), sits on top of rack 602 and is used to control the supply and return of cooling liquid to and from manifolds M1-M3, especially in cases where any of the manifolds starts operating at reduced capacity, for instance due to maintenance, or fails completely.

Cooling unit 604 includes three pairs of fluid lines: a first pair including supply line S1 and return line R1, a second pair including supply line S2 and return line R2, and a third pair including supply line S3 and return line R3. Supply lines S1-S3 are adapted to fluidly couple manifold supply chambers MS1, MS2, and MS3 to a facility supply line 208, while return lines R1-R3 are adapted to fluidly couple manifold return chambers MR1, MR2, and MR3 to a facility return line 210. Facility supply line 208 and facility return line 210 are lines that are part of a central fluid distribution system in the data center, or other facility in which system 200 is located, that provides cooling fluid to racks or clusters of racks within the facility.

Two pairs of bi-directional bypass lines are located within unit 604. The first pair includes bypass lines B1 and B2, both fluidly coupled between supply lines S1 and S2. The second pair includes bypass lines B3 and B4, both fluidly coupled between supply lines S2 and S3. Thus, supply line S2 is fluidly coupled to all four bypass lines B1-B4. All four bypass lines B1-B4 are bi-directional, meaning that fluid can flow in either direction through all or part of each bypass line. Bypass lines B1-B4 can also be referred to as redundancy lines, because they provide fluid supply redundancy in case any of manifolds M1-M3 has problems (see FIGS. 3A-3B). Pump P1 can be coupled between bypass lines B1 and B2 and pump P2 can be coupled between bypass lines B3 and B4 to help regulate the flow of fluid in the cooling unit. Although not shown in the drawing, other embodiments of cooling system 604 can include additional components analogous to those shown in FIG. 4. Other embodiments, for instance, can include some or all of the following components: control valves fluidly coupled in one or more of supply lines S1-S3; flow meters fluidly coupled in one or more of supply lines S1-S3; a controller communicatively coupled to pumps P1 and P2, valves, and flow meters, if present, to control their operation; and other components to help control the flow of cooling fluid.

With the illustrated arrangement, both columns 602a and 602b of rack 602 provide access to a redundant cooling fluid supply for IT equipment with multiple fluid connections, while also providing non-redundant cooling fluid supply for IT equipment without multiple fluid connections. In the illustrated embodiment, for instance, column 602a is populated with a piece of IT equipment 606 that has multiple fluid connections and can be fluidly coupled to both manifolds M1 and M2 and is also populated with multiple pieces of IT equipment 608 that have only a single fluid connection and can be fluidly coupled only to manifold M1. Thus IT equipment 606 has a redundant fluid supply, while IT equipment 608 does not. Similarly, column 602b is populated with multiple pieces of IT equipment 610 that have multiple fluid connections and can be coupled to both manifolds M2 and M3 and is also populated with multiple pieces of IT equipment 612 that have only single fluid connections and can be coupled only to manifold M3. Thus IT equipment 610 has a redundant fluid supply, while IT equipment 612 does not. In other embodiments columns 602a and 602b can, of course, be populated differently, and with different components, than shown.

With arrangements such as the one shown, IT equipment in rack 602 can be operated various different ways. For instance, in one embodiment the IT equipment with redundant fluid supplies (606 and 610) can be operated in the rack redundant mode while half of the servers without redundant fluid supply (608 and 612) can be operated during the rack redundant model. This also enables migration of some workload to the rack or to some of the servers in the rack during the redundant mode, with major potential cost reduction on both rack and server sides.

Other fluid distribution embodiments are possible besides the ones described above. For instance:

The servers populated to the rack can be in different form factors, such as blade servers or ones in sled form factor.

The system can be a single-phase (e.g., liquid) system or a multi-phase system, for instance a vapor-liquid system.

The rack can have a different form factors, such as with a larger width.

The above description of embodiments is not intended to be exhaustive or to limit the invention to the described forms. Specific embodiments of, and examples for, the invention are described herein for illustrative purposes, but various modifications are possible.

What is claimed is:

1. An apparatus comprising:
a first pair of fluid lines including a first supply line and a first return line, the first supply line and the first return line being adapted to be coupled to a first rack manifold including a first supply manifold and a first return manifold, wherein the first supply line is adapted to be coupled to the first supply manifold and the first return line is adapted to be coupled to the first return manifold;
a second pair of fluid lines including a second supply line and a second return line, the second supply line and the second return line being adapted to be coupled to a second rack manifold, the second rack manifold being positioned in the same rack as the first rack manifold and including a second supply manifold and a second return manifold, wherein the second supply line is adapted to be coupled to the second supply manifold and the second return line is adapted to be coupled to the second return manifold; and first and second bi-directional fluid lines fluidly coupled between the first supply line and the second supply line.

2. The apparatus of claim 1, further comprising a pump fluidly coupled between the first and second bidirectional fluid lines.

3. The apparatus of claim 2, further comprising a first flow meter fluidly coupled to the first supply line to measure a first flow rate and a second flow meter fluidly coupled to the second supply line to measure a second flow rate.

4. The apparatus of claim 3, further comprising a controller coupled to the first flow meter, the second flow meter, and the pump.

5. The apparatus of claim 4 wherein the controller is adapted to adjust the pump to maintain constant the sum of the first flow rate and the second flow rate.

6. The apparatus of claim 1, further comprising a first control valve fluidly coupled in the first supply line and a second control valve fluidly coupled in the second supply line.

7. The apparatus of claim 1, further comprising:
a third pair of fluid lines including a third supply line and a third return line, the third supply line and the third return line being adapted to be coupled to a third rack manifold in the same rack as the first and second rack manifolds; and
third and fourth bi-directional fluid lines fluidly coupled between the third supply line and the second supply line.

8. The apparatus of claim 7, further comprising a pump coupled between the third and fourth bi-directional fluid lines.

9. An information technology (IT) system comprising:
an IT rack having a first rack manifold and a second rack manifold, the first rack manifold including a first supply manifold and a first return manifold and the second rack manifold including a second supply manifold and a second return manifold; and
a redundant cooling control unit (RCCU) coupled to the IT rack, the RCCU including:
a first pair of fluid lines including a first supply line and a first return line, the first supply line being coupled to the first supply manifold and the first return line being coupled to the first return manifold,
a second pair of fluid lines including a second supply line and a second return line, the second supply line being coupled to the second supply manifold and the second return line being coupled to the second return manifold, and
first and second bi-directional fluid lines fluidly coupled between the first supply line and the second supply line.

10. The system of claim 9, further comprising a pump fluidly coupled between the first and second bidirectional fluid lines.

11. The system of claim 10, further comprising a first flow meter fluidly coupled to the first supply line to measure a first flow rate and a second flow meter fluidly coupled to the second supply line to measure a second flow rate.

12. The system of claim 11, further comprising a controller coupled to the first flow meter, the second flow meter, and the pump.

13. The system of claim 12 wherein the controller adjusts the pump to maintain constant the sum of the first flow rate and the second flow rate.

14. The system of claim 9, further comprising a first control valve fluidly coupled in the first supply line and a second control valve fluidly coupled in the second supply line.

15. The system of claim 9 wherein the rack further comprises a third rack manifold positioned to that the second rack manifold is between the first and third rack manifolds and wherein the cooling control unit further comprises:
a third pair of fluid lines including a third supply line and a third return line, the third supply line and the third return line being adapted to be coupled to the third rack manifold; and
third and fourth bi-directional fluid lines fluidly coupled between the third supply line and the second supply line.

16. The system of claim 15, further comprising a pump coupled between the third and fourth bi-directional fluid lines.

17. A data center cooling system comprising:
a facility supply line and a facility return line; and
a plurality of IT racks grouped into clusters of two or more IT racks, each IT rack comprises:
a first rack manifold including a first supply manifold and a first return manifold,
a second rack manifold including a second supply manifold and a second return manifold,
a first pair of fluid lines including a first supply line and a first return line, the first supply line being coupled between the facility supply line and the first supply manifold and the first return line being coupled between facility return line and the first return manifold,
a second pair of fluid lines including a second supply line and a second return line, the second supply line being coupled between the facility supply line and the second supply manifold and the second return line being coupled between the facility return line and the second return manifold, and
a first bi-directional fluid line fluidly coupled between the first supply line and the second supply line.

18. The data center cooling system of claim 17, further comprising a pump coupled in the facility supply line so that the pump serves multiple racks.

19. The data center cooling system of claim 17, further comprising a second bi-directional fluid line fluidly coupled between the first supply line and the second supply line.

20. The data center cooling system of claim 19, further comprising at least one of:
a pump fluidly coupled between the first and second bi-directional fluid lines;
a first control valve coupled in the first supply line and a second control valve coupled in the second supply line;
a first flow meter coupled in the first supply line and a second flow meter coupled in the second supply line; and
a controller communicatively coupled to the pump, the first and second control valves, and the first and second flow meters.

* * * * *